United States Patent [19]

Nihashi et al.

[11] 4,025,849

[45] May 24, 1977

[54] METHOD OF MEASURING ANALOG INPUT VOLTAGES THROUGH ISOLATION TRANSFORMERS AND APPARATUS FOR THE SAME

[75] Inventors: Yoshiyuki Nihashi; Ikuho Horinaka; Syuichi Senda, all of Hitachi; Kazuo Katou, Ibaraki; Takashi Sase, Hitachi, all of Japan

[73] Assignee: Hitachi, Ltd., Japan

[22] Filed: Aug. 29, 1975

[21] Appl. No.: 609,021

[30] Foreign Application Priority Data

Aug. 30, 1974 Japan .............................. 49-99630

[52] U.S. Cl. .............................. 324/127; 324/117 R
[51] Int. Cl.² .................... G01R 1/20; G01R 19/00
[58] Field of Search ............... 324/127, 117 R, 102, 324/132; 235/151.31

[56] References Cited

UNITED STATES PATENTS 2,304,535  12/1942  Bush .............................. 324/127

*Primary Examiner*—Rudolph V. Rolinec
*Assistant Examiner*—Ernest F. Karlsen
*Attorney, Agent, or Firm*—Craig & Antonelli

[57] ABSTRACT

In measuring analog input voltages through isolation transformers, an analog input voltage $V_{in}$ is applied across a primary winding of the isolation transformer, voltages $V_A$ and $V_B$ developing across the secondary winding of lapses of time $T_A$ and $T_B$ ($T_A < T_B$) from application of the analog input voltage are detected, and by using measured times $T_A$ and $T_B$ and secondary winding voltages $V_A$ and $V_B$, the analog input voltage $V_{in}$ is calculated in accordance with an expression $$V_{in} = V_B + \frac{T_B}{T_B - T_A} \times (V_A - V_B),$$

whereby influence of sag due to the isolation transformer is compensated for.

7 Claims, 5 Drawing Figures

METHOD OF MEASURING ANALOG INPUT VOLTAGES THROUGH ISOLATION TRANSFORMERS AND APPARATUS FOR THE SAME

BACKGROUND OF THE INVENTION

This invention generally relates to an improved method of measuring analog voltages through isolated circuits and an apparatus for the same.

When measuring an analog input voltage through an isolated circuit, it is a practice to use an isolation transformer (hereinafter referred to as transformer). For measurement of a plurality of analog input voltages, the voltages applied across primary windings of transformers are selected on the time division base. In the case of transmitting a voltage through the transformer, even when a load or a resistor connected across the primary winding of the transformer is infinite and coupling coefficient of the transformer is approximately 1 (one), a ratio between the primary voltage and the secondary voltage cannot be identical with the winding ratio of transformer because of influence of sag. "Sag" refers to that phenomenon which occurs when an analog input voltage is applied across the primary winding of transformer, a secondary voltage is decreased with time with the result that the analog input voltage is prevented from being transmitted accurately to the secondary side. Sag is caused by the fact that both direct current resistances of the primary winding of transformer and of an input selection switch connected across the primary winding of the transformer are of finite value, and the magnitude of sag is given by the following equation $$V_2 = V_{in} \cdot \exp\left(-\frac{R}{L}t\right),$$

where $V_2$ represents a secondary voltage of the transformer, $V_{in}$ an analog input voltage, L a primary inductance of the transformer, R a sum of direct current resistances of the primary winding and the input selection switch, and $t$ time lapse from closure of the input selection switch.

Compensation for influence of sag is needed for a highly accurate measurement. The need for such compensation is commonly recognized and a typical measure is with the use of a three winding type transformer.

According to the expedient mentioned above, voltages developing across secondary windings connected to a common component of a measuring instrument are integrated and the integrated outputs are added to the output of an amplifier to make equal the integrated outputs to reductions due to sag, thereby compensating for the influence of sag.

The prior art measure had difficulties with accurate compensation for sag for the following reasons (1) and (2).

1. Input selection switches cannot have an identical direct current resistance because of the irregularities of their elements, and 2. Transformers cannot have an identical inductance because of the irregularities of their elements. (In general, about ±3% irregularities are allowed.) It will be seen from the above reasons (1) and (2) and the above-mentioned equation for the voltage $V_2$ that the magnitude of sag varies from input point to input point.

On the other hand, the integrated output for compensating for sag is smaller than for larger sag. Therefore, in view of the above-mentioned reasons (1) and (2), it is difficult to compensate for sag with accuracy.

In order to accurately compensate for the influence of sag, it is considered that, in connection with the reason (1), the input selection switch is connected in series with a variable resistor and the variable resistor is so adjusted that a sum of direct current resistances of the input selection switch and variable resistor of each channel are unified to a specified value and that, in connection with the reason (2), a transformer having a constant inductance is strictly selected for each channel. However, even if the above points are considered, variation in the ambient temperature causes the total resistance R and the inductance L in the above-mentioned equation for the voltage $V_2$ to vary and as a result, it is difficult to accurately compensate for sag without fail. In addition, realization of the aforementioned points inevitably leads to a high cost and the adjustment of the variable resistor is time consuming.

In conclusion, the prior art technique hereinbefore described has disadvantages as follows.

a. Failure to compensate for sag with high accuracy (variation in ambient temperature involved);
b. High cost;
c. Time consuming adjustment work; and
d. Difficulty of characteristic control of the parts.

SUMMARY OF THE INVENTION

A principal object of this invention is to provide an improved method of and apparatus for measuring analog voltages capable of completely compensating for the sag even when irregularity in direct current resistance values of input selection switches and irregularity in inductance values of transformers exist.

This invention is characterized in that secondary voltages of the transformer are twice measured at different time points, the amount of compensation for the sag is automatically determined by the measured voltages, and the input voltage is calculated.

DETAILED DESCRIPTION OF THE PREFERRED EMBODIMENTS

Prior to giving a description of preferred embodiments of the invention, the principle thereof will be explained with reference to FIG. 1.

Figure 1:
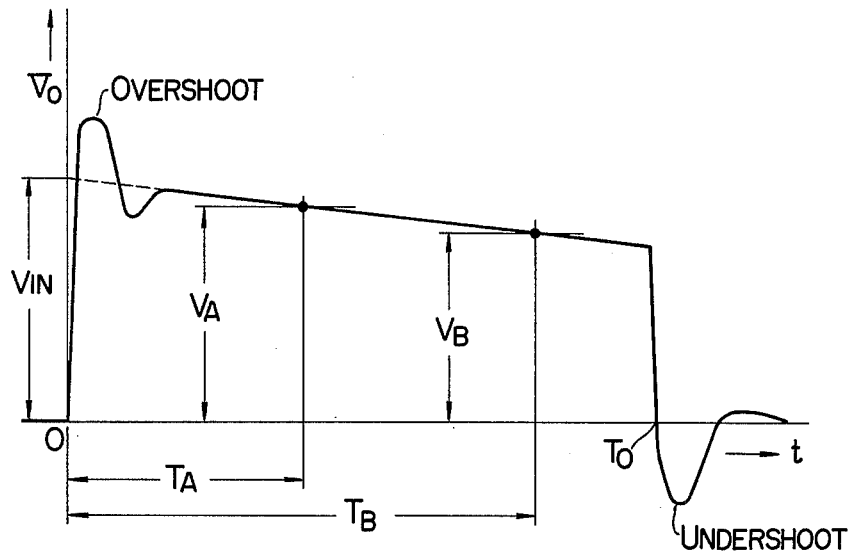
FIG. 1 is a waveform diagram useful to explain the principle of the invention.

As shown in FIG. 1, a secondary voltage $V_o$ of the transformer is accompanied with an overshoot generated at a moment that an input selection switch (not shown) is closed and with a subsequent gradual reduction in the voltage due to the influence of sag, which gradual reduction continues until an undershoot is generated by opening the input selection switch at $T_o$ (a specified value of time $t$), and finally the secondary voltage approaches zero. For accurate measurement of an input voltage $V_{in}$, voltages $V_A$ and $V_B$ are measured at optional time points $T_A$ and $T_B$ ($T_A \neq T_B$) after the overshoot is terminated and a point at which an extension line connecting the voltage values $V_A$ and $V_B$ is crossed with the ordinate at $t = 0$ is determined.

Where symbol R represents a sum of direct current resistances of a primary winding of the transformer and the input selection switch, L a primary inductance of the transformer and $t$ the lapse of time from the closure of the input selection switch, the relation between the secondary voltage $V_o$ of transformer and analog voltage $V_{in}$ is given by the following equation, $$V_o = V_{in} \cdot \exp\left(-\frac{R}{L} \cdot t\right) \tag{1}$$

From equation (1), the voltages $V_A$ and $V_B$ at time points $T_A$ and $T_B$ are obtained as, $$V_A = V_{in} \cdot \exp\left(-\frac{R}{L} \cdot T_A\right) \tag{2}$$

$$V_B = V_{in} \cdot \exp\left(-\frac{R}{L} \cdot T_B\right) \tag{3}$$

Equation (1) can be approximated, for R, L and $t$ which satisfy $1 \gg R/L \cdot t$, as $$V_o \approx V_{in} \cdot \left(1 - \frac{R}{L} t\right) \tag{4}$$

$R/L \cdot t = 0.04$, for example, an error resulting from the approximation of equation (1) to equation (4) is 0.0008, i.e. 0.08%.

Similarly, equations (2) and (3) are approximated in view of equation (4) as, $$V_A \approx V_{in} \cdot \left(1 - \frac{R}{L} \cdot T_A\right) \tag{5}$$

$$V_B \approx V_{in} \cdot \left(1 - \frac{R}{L} \cdot T_B\right) \tag{6}$$

In consequence, with known values of the voltages $V_A$ and $V_B$, input voltage $V_{in}$ can be obtained, regardless of the magnitude of the total resistance and the inductance, from $$V_{in} = V_B + \frac{T_B}{T_B - T_A} \cdot (V_A - V_B) \tag{7}$$

Namely, by measuring the voltages at points corresponding to the lapses of time from closure of the input selection switch within a range in which the influence of the overshoot disappears and then by calculating these voltages under equation (7), it is possible to measure any input voltages with accuracy and without the influence of the sag.

Figure 2:
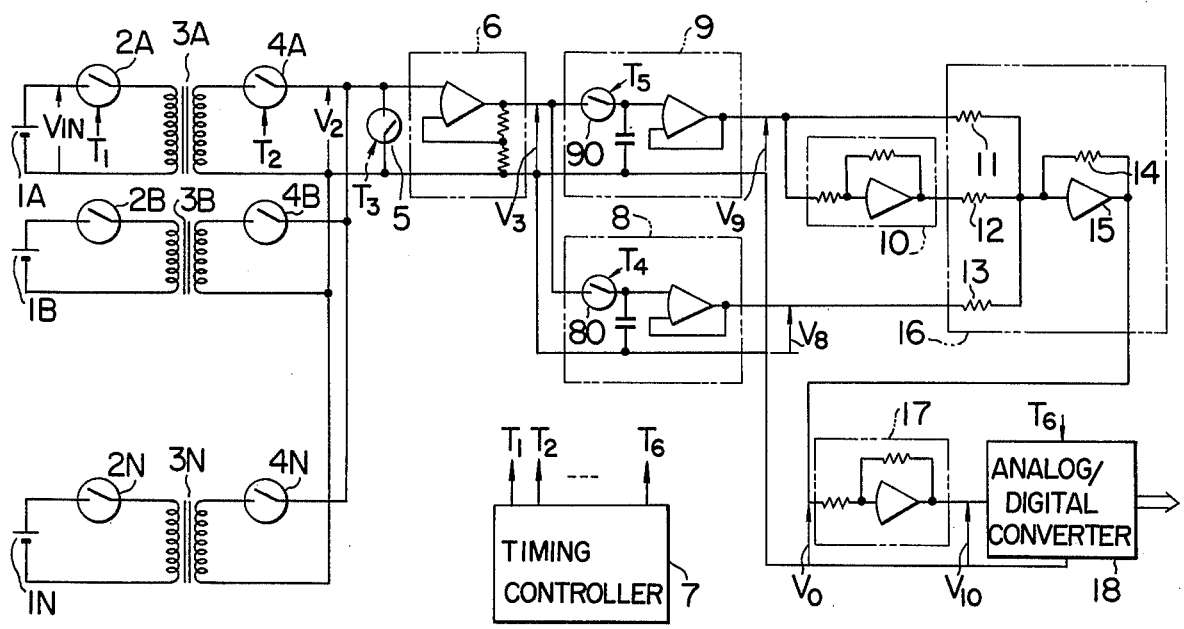
FIG. 2 is a circuit diagram of one embodiment specifically embodying the invention in terms of an analog circuit.
Figure 3:
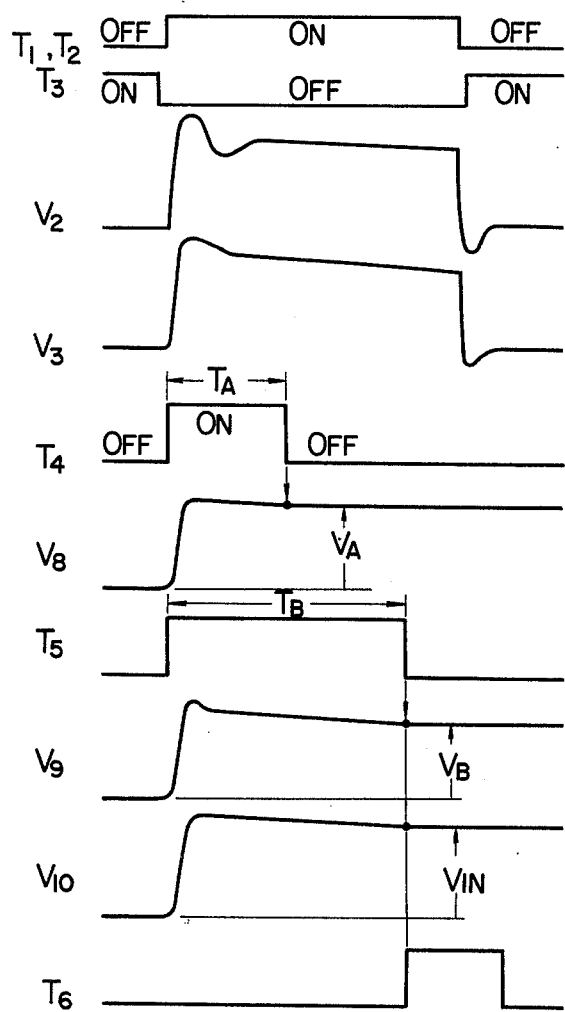
FIG. 3 is a time chart useful to explain the operation of the circuit shown in FIG. 2.

Referring now to FIGS. 2 and 3, a measuring and operational apparatus embodying the invention in terms of an analog circuit will be described.

Sources 1A, 1B, . . ., 1N of analog input voltages to be measured are connected to an amplifier 6 respectively through input selection switches 2A, 2B, . . ., 2N, transformers 3A, 3B, . . ., 3N and switches 4A, 4B, . . ., 4N to be enabled and disabled in synchronism with the input selection switches. The input selection switches 2A, 2B, . . ., 2N and the switches 4A, 4B, . . ., 4N are synchronously enabled and disabled by outputs $T_1$ and $T_2$ of a timing control circuit 7 on the time division base. Numeral 5 designates a short-circuiting switch inserted across the input side of amplifier 6 for discharging electric change due to stray capacitance in advance of times giving different measuring points thereby to reduce interaction between the adjacent measuring points.

A relation between ON-OFF timing of the switches 2A and 4A designated at $T_1$ and $T_2$ and ON-OFF timing $T_3$ of the short-circuiting switch 5 is illustrated in FIG. 3.

Numeral 8 designates a sample hold amplifier for sample holding an output of the amplifier 6 at time $T_A$, and 9 the other sample hold amplifier for sample holding an output of the amplifier 6 at time $T_B$. In order to allow the sample hold amplifiers 8 and 9 to hold outputs of the amplifier 6 at different time points $T_A$ and $T_B$, ON-OFF timings of switches 80 and 90 designated at $T_4$ and $T_5$, respectively, are controlled by the timing control circuit 7 as shown in FIG. 3. For convenience of description, it is specifically assumed that $T_B = 2 \cdot T_A$. Thus, equation (7) becomes $$V_{in} = V_B + 2 \cdot (V_A - V_B) \tag{8}$$

Numeral 10 designates an inverting amplifier of unity gain, 16 an analog adder comprised of operational resistors 11 to 14 and an operational amplifier 15. Assumed that resistances of the operational resistors 11 to 14 are $R_{11}$, $R_{12}$, $R_{13}$ and $R_{14}$, respectively, and they are related to $R_{11} = R_{14} = 2R_{12} = 2R_{13}$, the output $V_o$ obtainable from the analog adder 16 is expressed as $$V_o = -\{V_9 + 2 \cdot (V_8 - V_9)\} \tag{9}$$

where $V_8$ and $V_9$ correspond to outputs of the sample hold amplifiers 8 and 9, respectively, at different times $T_A$ and $T_B$ as shown in FIG. 2.

Accordingly, in comparison of equation (9) with equation (8), it follows that, $$V_{in} = -V_o \tag{10}$$

Since an inverting amplifier 17 of unity gain delivers an output $V_{10}$ which is related to the output $V_{10}$ as $$V_{10} = -V_o \tag{11}$$

the input voltage $V_{in}$ to be measured can be obtained by $$V_{in} = V_{10} \tag{12}$$

resulting in the output $V_{10}$ of inverting amplifier 17. Numeral 18 designates an analog to digital converter for converting the analog voltage $V_{10}$ into a digital quantity in synchronism with a timing signal $T_6$. As has been described, a simple analog operational circuit of FIG. 2 permits the measurement of the analog input voltage $V_{in}$ without influence of the sag, and its output may be converted into a digital quantity, as desired.

Figure 4:
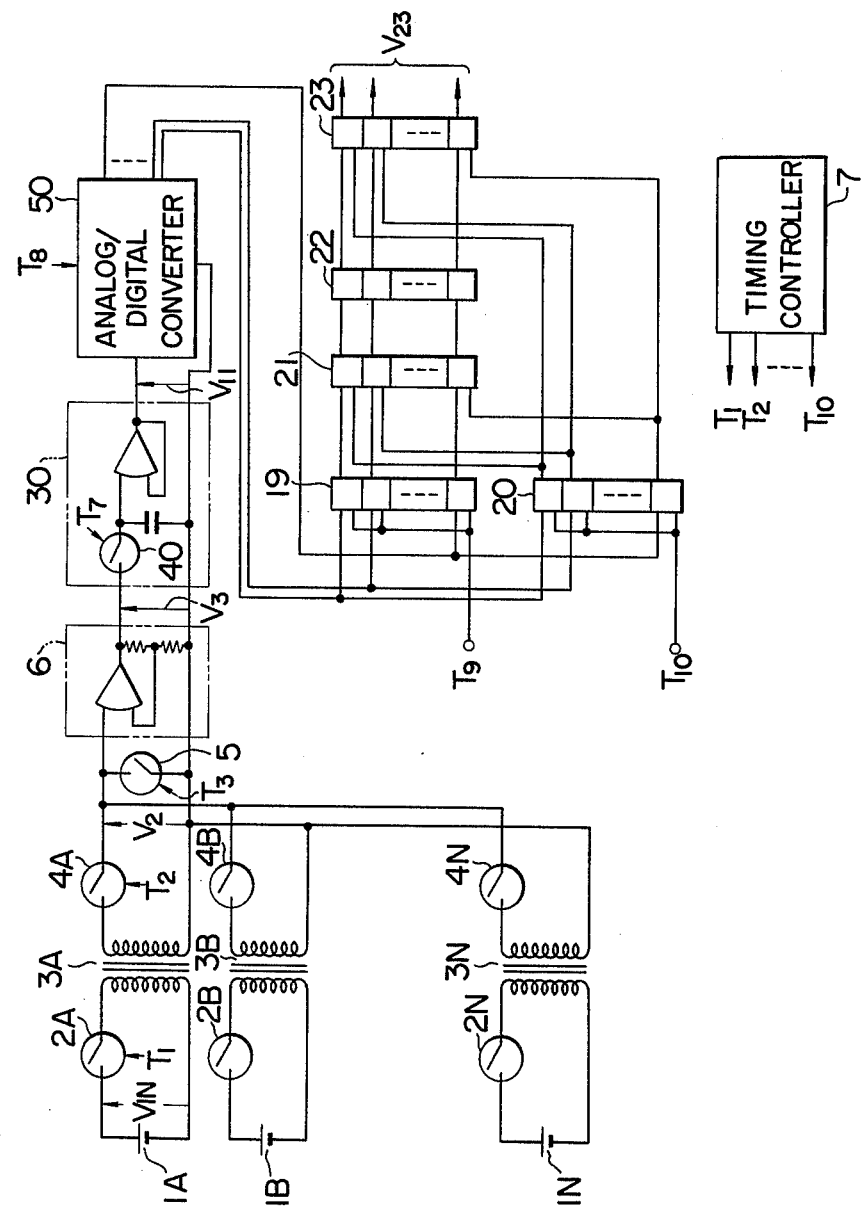
FIG. 4 is a circuit diagram of another embodiment specifically embodying the invention in terms of a digital circuit.
Figure 5:
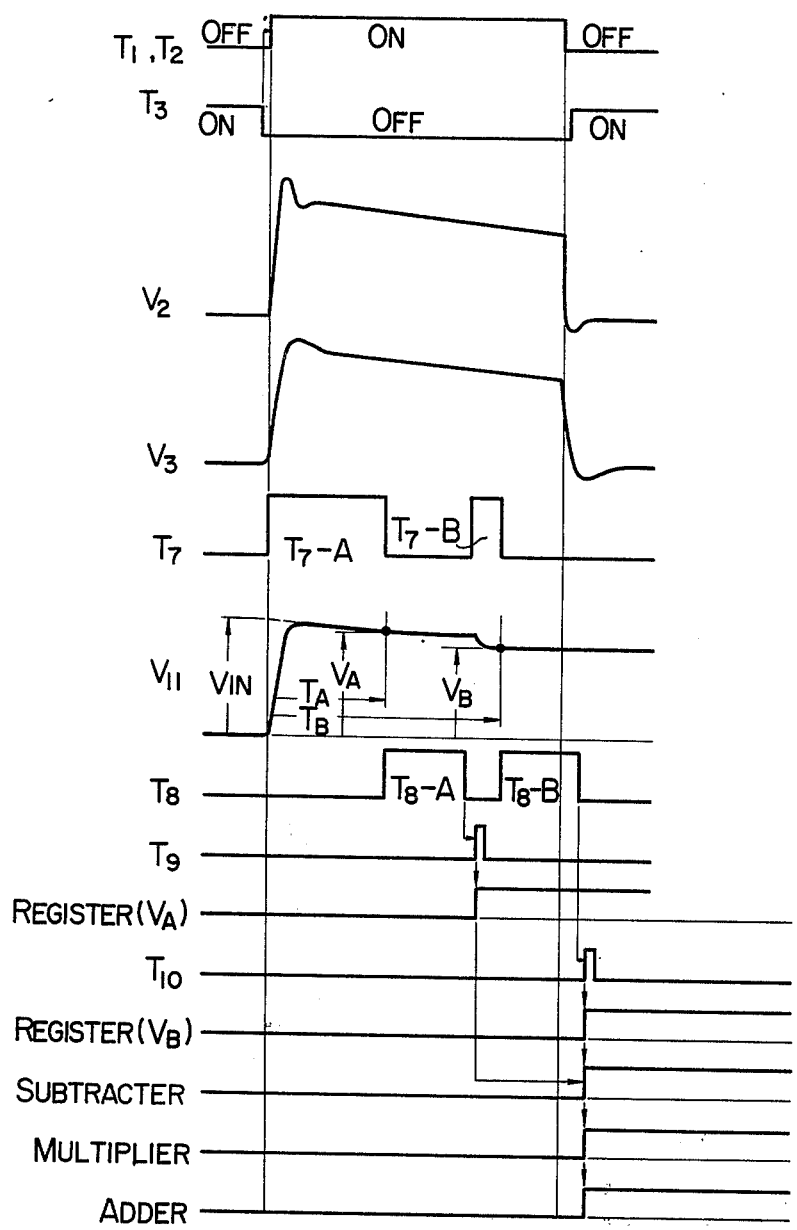
FIG. 5 is a time chart useful to explain the operation of the circuit shown in FIG. 4.

Turning to FIGS. 4 and 5, another measuring and operation apparatus embodying the invention in the form of a digital circuit will be described.

A sample hold amplifier 30 shown in FIG. 4 sample holds, in response to ON-OFF timing $T_7$ of a switch 40 (including timing signals $T_{7-A}$ and $T_{7-B}$), outputs of the amplifier 6 at elapses of time $T_A$ and $T_B$ and delivers them out. Therefore, as understood from FIG. 5, an output $V_{11}$ of the sample hold amplifier 30 holds the voltage $V_A$ after the elapse of time $T_A$ until it receives the timing signal $T_{7-B}$, and does hold the voltage $V_B$ after the elapse of time $T_B$ and receiving the timing signal $T_{7-B}$. Numeral 50 designates an analog to digital converter which converts the analog voltage $V_B$ into a digital quantity in response to a timing signal $T_8$ (including signals $T_{8-A}$ and $T_{8-B}$), specifically, converting the analog voltage $V_A$ in response to the timing signal $T_{8-A}$ and the analog voltage $V_B$ in response to the timing signal $T_{8-B}$. After completion of the analog to digital conversion, the digital outputs are registered into registers 19 and 20 by timing signals $T_9$ and $T_{10}$. Numeral 21 designates a digital subtracter adopted to effect subtraction between outputs of the register 19 and those of the register 20. Numeral 22 designates a multiplier in which the output of the subtracter 21 is multiplied by $T_B/T_B - T_A$. Further, numeral 23 designates a digital adder in which the outputs of multiplier 22 are added to the content of the register 20. The content of register 20 corresponds to the voltage $V_B$ in equation (7) so that outputs $V_{23}$ of the adder 23 correspond to results obtainable from equation (7) which are digitally operated or calculated. Thus, it is possible to digitally measure the input analog voltage $V_{in}$ with accuracy.

Meritorious features obtainable from the preferred embodiments of the invention will be summarized as follows:

1. Since the sag is accurately compensated for, the analog input voltage can be measured through an isolation circuit with high accuracy (less than ±0.1% error);

2. The compensation for sag according to this invention is almost free from the influence of irregularity in characteristics of the elements such as the input selection switch and transformer so that such irregularity never affects the accuracy of the measurement, thus assuring reduction in time for adjustment work;

3. Variations in characteristics of the input selection switch and transformer due to ambient temperature never affect the accuracy of the measurement; and 4. The above features (1) to (3) permit a simple circuit construction which meets economic requirements.

We claim:

1. A method of measuring analog input voltages through isolation transformers wherein each of said analog input voltages is applied across a primary winding of associated one of the isolation transformers through an input selection switch and a secondary winding of each of the isolation transformers is connected across the input of amplifier means, the improvement which comprises the steps of detecting voltages $V_A$ and $V_B$ developing across the secondary winding after elapses of time $T_A$ and $T_B$ ($T_A < T_B$), respectively, from closure of the input selection switch to apply an analog input voltage $V_{in}$ and calculating the analog input voltage $V_{in}$ from the values of $T_A$, $T_B$, $V_A$ and $V_B$ in accordance with the following equation:

$$V_{in} = V_B + \frac{T_B}{T_B - T_A} \times (V_A - V_B).$$

2. An apparatus for measuring analog input voltages through isolation transformers comprising analog input voltage sources each connected across a primary winding of associated one of the isolation transformers through an input selection switch, amplifier means having the input connected across secondary windings of the isolation transformers, two sample hold amplifiers for sample holding outputs $V_A$ and $V_B$ of said amplifier developing after elapses of time $T_A$ and $T_B$ ($T_A < T_B$), respectively, from closure of the input selection switch to apply an analog input voltage $V_{in}$, one of which sample hold amplifiers sample holds the output $V_A$ at the elapse of time $T_A$ and the other of which holds the output $V_B$ at the elapse of time $T_B$, an analog adder having operational resistors whose resistances are determined in a predetermined relation, to which analog adder the outputs of said two sample hold amplifiers are applied and in which the analog input voltage $V_{in}$ is analogly calculated in accordance with the following equation:

$$V_{in} = V_B + \frac{T_B}{T_B - T_A} \times (V_A - V_B).$$

3. An apparatus for measuring analog input voltages through isolation transformers comprising analog input voltage sources each connected across a primary winding of associated one of the isolation transformers through an input selection switch, amplifier means having input connected across secondary windings of the isolation transformers, a sample hold amplifier for sample holding for a predetermined time duration outputs $V_A$ and $V_B$ of said amplifier developing after elapses of time $T_A$ and $T_B$ ($T_A < T_B$), respectively, from closure of the input selection switch to apply an analog input voltage $V_{in}$, an analog to digital converter for converting at different time points the outputs of said sample hold amplifier into digital quantities, registers for registering the resultant digital quantities thereinto, and means for digitally calculating the analog input voltage $V_{in}$ in accordance with the following equation:

$$V_{in} = V_B + \frac{T_B}{T_B - T_A} \times (V_A - V_B).$$

4. The analog input voltage measuring apparatus according to claim 2 which comprises a plurality of sources 1A, 1B, . . ., 1N of analog input voltages to be measured respectively connected across primary windings of isolation transformers 3A, 3B, . . ., 3N through first input selection switches 2A, 2B, . . ., 2N, and an amplifier connected in common with secondary windings of said isolation transformers 3A, 3B, . . ., 3N respectively through second input selection switches 4A, 4B, . . ., 4N adapted to be enabled and disabled in synchronism with said first input selection switches 2A, 2B, . . ., 2N respectively, wherein said first and second input selection switches 1A, 1B, . . ., 1N and 4A, 4B, . . ., 4N are enabled and disabled on the time division base to send the analog input voltages from said sources 1A, 1B, . . ., 1N to said amplifier means thereby to measure the plurality of analog input voltages.

5. The analog input voltage measuring apparatus according to claim 4 which comprises sample hold amplifiers (8, 9) for sample holding the outputs $V_A$ and $V_B$ of said amplifier developing at the elapses of time $T_A$ and $T_B$ respectively, a first inverting amplifier (10) for effecting phase inversion of an output of one (9) of the sample hold amplifiers, an analog adder (16) receiving three inputs in the form of the outputs from said sample hold amplifiers (8, 9) and said first inverting amplifier (10), a second inverting amplifier (17) for effecting phase inversion of an output of said analog adder (16), and an analog to digital converter for converting an output of said second inverting amplifier (17) into a digital quantity, whereby analog operation results are converted into digital quantities.

6. The analog input voltage measuring apparatus according to claim 3 which comprises a plurality of sources 1A, 1B, . . ., 1N of analog input voltages to be measured respectively connected across primary windings of insulating transformers 3A, 3B, . . ., 3N through first input selection switches 2A, 2B, . . ., 2N, and an amplifier connected in common with secondary windings of said isolation transformers 3A, 3B, . . ., 3N respectively through second input selection switches 4A, 4B, . . ., 4N adapted to be enabled and disabled in synchronism with said first input selection switches 2A, 2B, . . ., 2N, wherein said first and second input selection switches 1A, 1B, . . ., 1N and 4A, 4B, . . ., 4N are enabled and disabled on the time division base to send the analog input voltages from said sources 1A, 1B, . . ., 1N to said amplifier means thereby to measure the plurality of analog input voltages.

7. The analog input voltage measuring apparatus according to claim 3 which comprises two registers (19, 20) for registering digital quantities resulting from the analog to digital conversion, a subtracter (21) for effecting subtraction between contents of the registers (19, 20), a multiplier (22) for multiplying outputs of the subtracter (21) by $T_B/T_B - T_A$, and an adder (23) for adding contents of the register (20) to outputs of the multiplier (22), whereby digital operations are performed.

* * * * *